United States Patent [19]

Krenz

[11] Patent Number: 4,982,303

[45] Date of Patent: Jan. 1, 1991

[54] REMOVABLE HARD DISK DRIVE HAVING A COMBINATION LATCH, LEVER AND HANDLE

[75] Inventor: Horst M. Krenz, Bridgman, Mich.

[73] Assignee: Zenith Data Systems Corporation, Mt. Prospect, Ill.

[21] Appl. No.: 265,077

[22] Filed: Oct. 31, 1988

[51] Int. Cl.⁵ .................................................. G1B 31/00
[52] U.S. Cl. .................................... 360/137; 292/223; 292/DIG. 49; 361/426
[58] Field of Search ............................. 360/97.01, 137; 292/223, DIG. 49; 361/426, 420, 422

[56] References Cited

U.S. PATENT DOCUMENTS

| | | | |
|---|---|---|---|
| 4,230,351 | 10/1980 | Bisbing | 292/223 |
| 4,541,036 | 9/1985 | Landries et al. | 361/426 |
| 4,633,350 | 12/1986 | Hanson | 360/98.07 |
| 4,685,312 | 8/1987 | Lakoski et al. | 70/14 |

Primary Examiner—John H. Wolff

[57] ABSTRACT

Disclosed is an assembly for a hard disk drive which is removable from a computer. A latch is provided suitable for forcing the the drive into or out of engagement with the computer against resistance from mounting guide rails and an electrical connector. The latch is also suitable for locking the drive securely in place when it is in use and for carrying the drive between computers.

12 Claims, 2 Drawing Sheets

REMOVABLE HARD DISK DRIVE HAVING A COMBINATION LATCH, LEVER AND HANDLE

FIELD OF THE INVENTION

This invention relates to structures for attaching, securing, removing, and transporting removable hard disk drives for computers.

BACKGROUND OF THE INVENTION

Removable hard disk drives are commonly used on micro and mini computers. Removable hard disk drive provide a convenient way to transport mass storage from one computer to another. The disk drive must be held firmly in place while it is in use due to the precision tolerances involved in reading a hard disk. It is, however, advantageous to be able to remove, reinsert and transport the disk drive quickly and easily. It is also important to provide a positive lock to hold the drive in place when in use, to provide a handle for carrying the drive, to provide means for aligning, engaging, and disengaging the drive's electrical connector against considerable resistance.

There are several mechanism for removably attaching disk drives to computers. Toreson U.S. Pat. No. 4,717,982 and Hanson U.S. Pat. No. 4,633,350 disclose some common approaches. The invention features a latch similar to that disclosed in Bisbing U.S. Pat. No. 4,230,351. A good description of many removable hard disk drives available for microcomputers can be found in "Removable Mass Storage: You Can Take It With You." *PC Magazine,* Sept. 13, 1988.

OBJECTS OF THE INVENTION

It is the object of this invention to provide a latch for a removable disk drive that is less expensive to manufacture than prior art latches.

It is another object of this invention to provide a latch for a removable disk drive that can be conveniently locked in the closed position.

It is another object of this invention to provide a latch for a removable disk drive that can be also used as a handle for carrying the removable disk drive.

It is another object of this invention to provide an improved latch for effecting a more reliable connection between a removable disk drive and the computer to which it is attached.

It is another object of this invention to provide an improved latch for a removable disk drive which is operative to force the disk drive either into or out of the computer against considerable resistance.

BRIEF DESCRIPTION OF THE DRAWINGS

Preferred embodiments demonstrating the various objectives and features of the invention will now be described in conjunction with the following drawings.

DETAILED DESCRIPTION OF THE PREFERRED EMBODIMENTS OF THE INVENTION

The subject latch is capable of performing several functions necessary to the proper handling of removable disk drives. The latch is operative as a carrying handle to transport the disk drive, as a lever to force the drive into the computer against the resistance of guide rails and an electrical connector, as a lever to force the drive out of the computer against the resistance of the guide rails and electrical connector, and as a lock to secure the drive to the comPuter so it is rigidly held in place while in use.

Figure 1:
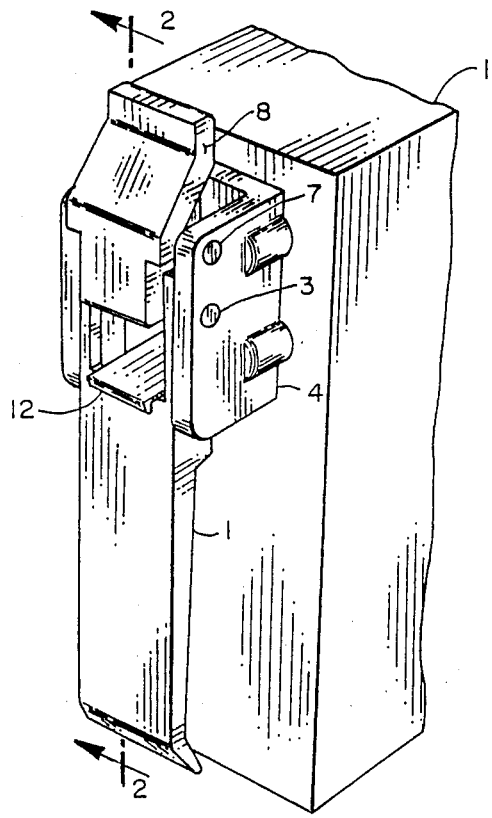
FIG. 1 is a top and side perspective view of the preferred latch.
Figure 2:
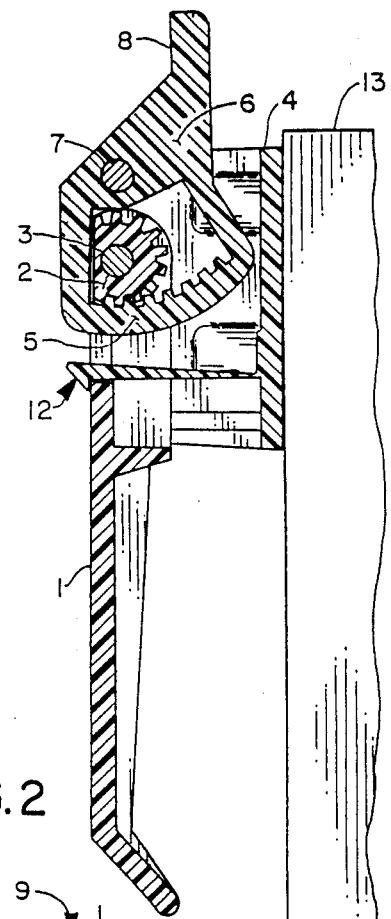
FIG. 2 is a side view of the preferred latch showing its internal structure.

Referring to FIGS. 1 and 2, the latch, secured to a removable disk drive is actuated by latch operating handle 1. The handle turns pinion gear 2 as the pinion gear pivots around handle pivot 3. The handle pivot is secured to lever support base 4. Pinion gear 2 engages internal sector gear 5. The internal sector gear is part of lever 6 which pivots around the lever pivot 7. Lever pivot 7 is secured to latch base 4. A projecting tongue 8 is located opposite sector gear 5 on lever 6. The tongue 8 engages latching channel 9, on the computer frame 14, between forward keeper 10 and aft keeper 11.

A latching action is effected by moving handle 1 toward lever support base 4. This action causes pinion gear 2 to rotate causing internal sector gear 5 to rotate, which in turn causes the tongue 8 to rotate against forward keeper 10 to pull the latch closed. The opposite manual motion applied to handle 1, causes tongue 8 to rotate against aft keeper 11 and pushes the latch open.

A locking finger 12 is secured to lever support base 4 extends up through handle 1 and hooks over the handle. The locking finger is a flat spring which can easily be pushed off the handle to open the latch but springs back over the handle whenever the latch is closed.

The use of gears, as opposed to levers as disclosed in Bisbing, provides for greater reliability at reduced cost. This is possible because of the reduced number of parts employed in the latch of this invention.

Figure 3:
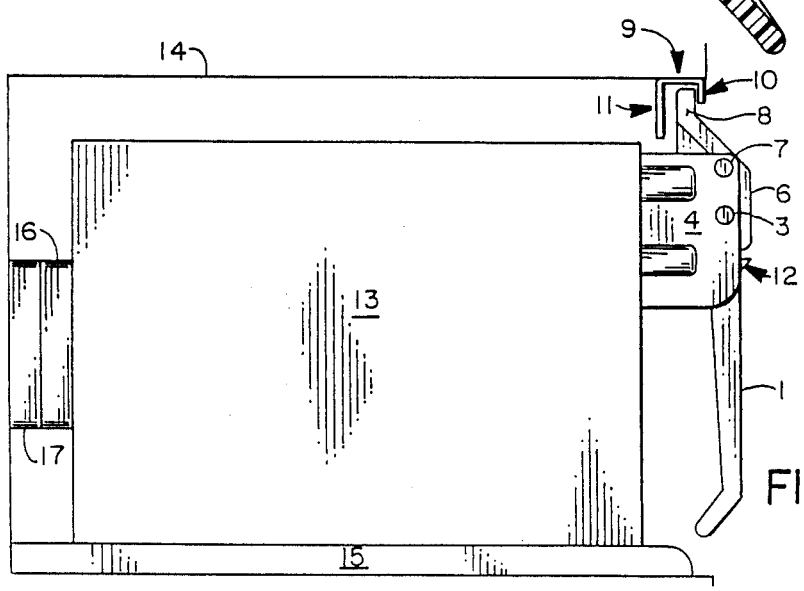
FIG. 3 is a side view of the preferred disk drive housing demonstrating the latch forcing the drive into engagement with an electrical connector.

Referring to FIG. 3, the latch is used in conjunction with a disk drive removable from a computer. Removable disk drive 13 is deposited in a computer frame 14 along guide rails 15. An electrical connector 16 at the rear of the disk drive engages a matching connector 17 on computer frame 14.

A considerable amount of force is required to engage connector 16 with matching connector 17. Handle 1 is longer than tongue 8 which causes a mechanical advantage for the handle over the tongue. Internal sector gear 5 has a larger diameter than the pinion gear 2 which causes further mechanical advantage of handle 1 over tongue 8. This mechanical advantage in combination with contact between tongue 8 and forward keeper 10 causes motion on handle 1 to easily force the connectors to engage. When the latch is fully closed locking finger 12 springs over handle 1 locking the disk drive in place.

Figure 4:
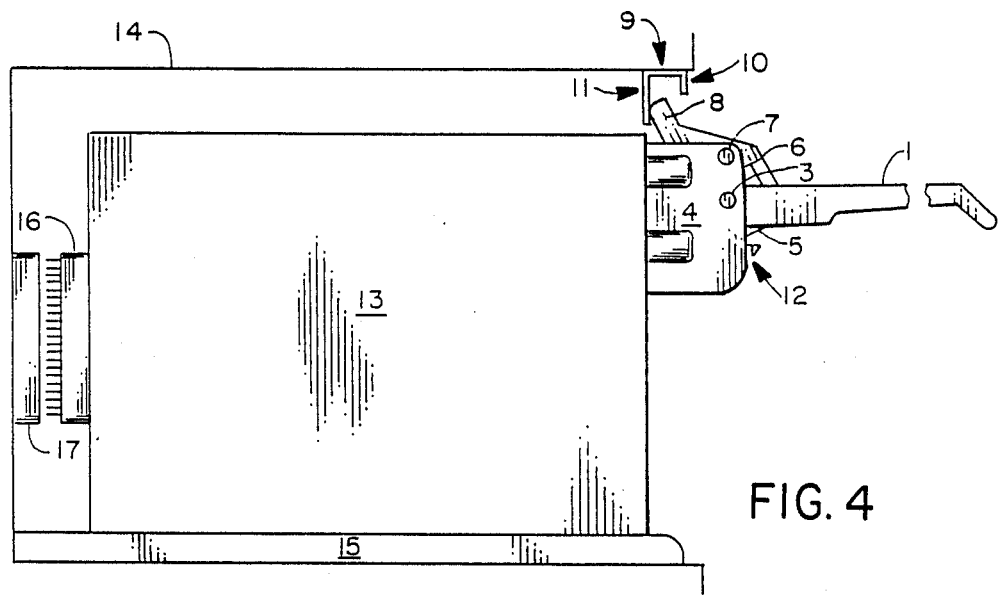
FIG. 4 is a side view of the preferred disk drive housing demonstrating the latch forcing the drive out of engagement with the electrical connector.

Referring to FIG. 4, the removable disk drive is removed by disengaging locking finger 12 from handle 1 and lifting the handle. This causes contact between tongue 8 and aft keeper 11 which forces connectors 16 and 17 apart. After tongue 8 is clear of forward keeper 10 the latch can be reclosed, causing locking finger 12 to reengage handle 1 so the handle provides suitable means for removing and transporting the disk drive.

Figure 5:
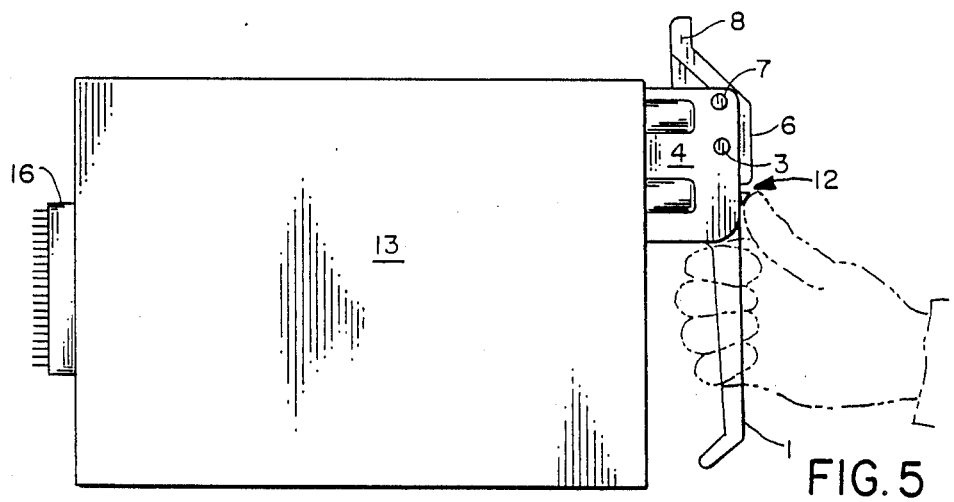
FIG. 5 is a side view of the preferred disk drive housing demonstrating how one would grasp the handle for carrying, inserting or removing to disk drive.

Referring to FIG. 5, locking finger 12 holds the handle in the latch position so that disk drive 13 can be held by handle 1. The handle is centered on disk drive 13 so the drive can easily be handled with one hand for inserting removing or transporting the drive. The locking finger 12 is disposed adjacent to the normal placement of the thumb so it can be operated by the same hand used to support the drive.

Although described above in terms of the preferred embodiment, the present invention is set forth with particularity in the appended claims. Such modifications and alterations as would be apparent to one of ordinary skill in the art and familiar with the teachings of this application shall be deemed to fall within the spirit and scope of the invention.

I claim:

1. In a computer, a removable disk drive and latch therefor, having a keeper element secured to the computer, for securing the removable disk drive to the computer comprising a lever support base secured to the removable disk drive, a lever pivotally supported on the lever support base by a pivot with first and second lever portions projecting in generally different directions relative to the pivot, the first lever portion having a projecting tongue disposed to selectively engage the keeper, the second lever portion being an internal sector gear, a pinion gear pivotally supported on the lever support base and engaging the sector gear, a latch operating handle coupled to the pinion gear to rotate the pinion gear and the engaged sector gear to actuate the tongue to effect a selective latching engagement with the keeper.

2. The removable disk drive and latch according to claim 1 wherein the sector gear is of larger diameter than the pinion gear whereby greater mechanical advantage can be exerted on the tongue by the latch operating handle.

3. The removable disk drive and latch according to claim 1 further comprising a spring biased locking finger secured at one end to the lever support base and having a hook at the other end that hooks to the latch operating handle whereby the latch operating handle is held in a latched position.

4. In a computer, a removable disk drive and latch therefor for securing the removable disk drive to the computer comprising a latching channel secured to the computer including a short forward keeper and a longer aft keeper, a lever support base secured the removable disk drive, a lever pivotally supported on the lever support base by an intermediate pivot with first and second lever portions projecting in generally different directions relative to the pivot, the first lever portion having a projecting tongue disposed to selectively engage the latching channel between the forward keeper and the aft keeper, the second lever portion being an internal sector gear, a pinion gear pivotally supported on the lever support base and engaging the sector gear, a latch operating handle coupled to the pinion gear to rotate the pinion gear and the engaged sector gear to actuate the tongue to effect a selective latching engagement with the keeper.

5. The removable disk drive and latch according to claim 4 wherein the internal sector gear is of larger diameter than the pinion gear whereby greater mechanical advantage can be exerted on the tongue by the latch operating handle.

6. The removable disk drive and latch according to claim 5 wherein mechanical advantage combined with contact between the tongue and the forward keeper is operable to force the disk drive into the computer and mechanical advantage combined with contact between the tongue and the aft keeper is operable to force the disk drive out of the computer.

7. The removable disk drive and latch according to claim 4 further comprising a locking finger secured at one end to the lever support base and having a hook at the other end that hooks to the handle whereby the handle is held in a latched position.

8. A computer with a removable disk drive comprising:

guide rails secured to the computer for receiving the removable disk drive;

a latching channel secured to the computer having a short forward keeper and a longer aft keeper; and a latch secured to the disk drive including a lever support base, a lever pivotally supported on the lever support base by an intermediate pivot with first and second lever portions projecting in generally different directions relative to the pivot, the first lever portion having a projecting tongue disposed to selectively engage the latching channel between the forward keeper and the aft keeper, the second lever portion being an internal sector gear, a pinion gear pivotally supported on the lever support base and engaging the sector gear, a latch operating handle coupled to the pinion gear to rotate the pinion gear and the engaged sector gear to actuate the tongue to effect a selective latch with the latching channel.

9. The computer according to claim 8 wherein the sector gear is of larger diameter than the pinion gear whereby greater mechanical advantage can be exerted on the tongue by the handle.

10. The computer according to claim 9 further comprising an electrical connector on the rear of the removable disk drive and a matching connector on the computer so structured and arranged that mechanical advantage combined with contact between the tongue and the forward keeper is operable to force the electrical connector to a connected position and mechanical advantage combined with contact between the tongue and the aft keeper is operable to force the connector to an disconnected position.

11. The latch according to claim 10 further comprising a locking finger secured at one end to the lever support base and having a hook at the other end that hooks to the handle whereby the handle is held in a latched position.

12. The latch according to claim 11 wherein the latch is so structured and arranged that when the handle is locked in the latched position by the locking finger, the handle will support the removable disk drive.

* * * * *